United States Patent
Chen et al.

(10) Patent No.: US 8,816,403 B2
(45) Date of Patent: Aug. 26, 2014

(54) EFFICIENT SEMICONDUCTOR DEVICE CELL LAYOUT UTILIZING UNDERLYING LOCAL CONNECTIVE FEATURES

(75) Inventors: Jung-Hsuan Chen, Hsinchu (TW); May Chang, Zhubei (TW); Chiting Cheng, Taichung (TW); Li-Chun Tien, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 7 days.

(21) Appl. No.: 13/238,294

(22) Filed: Sep. 21, 2011

(65) Prior Publication Data
US 2013/0069236 A1    Mar. 21, 2013

(51) Int. Cl.
*H01L 27/118* (2006.01)
*H01L 23/522* (2006.01)

(52) U.S. Cl.
USPC ............ 257/210; 257/207; 257/208; 257/776

(58) Field of Classification Search
USPC ......... 257/773, 207, 208, 211, 750, 756, 758, 257/765, 774, 776, E23.011, E23.019, 10, 257/E23.041; 438/128, 129, 618, 622, 652, 438/666
See application file for complete search history.

(56) References Cited

U.S. PATENT DOCUMENTS

| | | | | |
|---|---|---|---|---|
| 5,111,271 | A * | 5/1992 | Hatada et al. | 257/207 |
| 5,506,428 | A * | 4/1996 | Inoue et al. | 257/208 |
| 5,717,242 | A * | 2/1998 | Michael et al. | 257/386 |
| 5,924,008 | A * | 7/1999 | Michael et al. | 438/647 |
| 6,031,289 | A * | 2/2000 | Fulford et al. | 257/758 |
| 6,448,631 | B2 * | 9/2002 | Gandhi et al. | 257/635 |
| 6,486,056 | B2 * | 11/2002 | Pasch et al. | 438/622 |
| 7,064,985 | B2 | 6/2006 | Kuo | |
| 7,176,125 | B2 * | 2/2007 | Liaw | 438/637 |
| 7,495,296 | B2 | 2/2009 | Maeda et al. | |
| 7,969,011 | B2 * | 6/2011 | Sekar et al. | 257/774 |
| 8,004,042 | B2 * | 8/2011 | Yang et al. | 257/368 |
| 2001/0017417 | A1 * | 8/2001 | Kuroda | 257/758 |
| 2001/0052651 | A1 * | 12/2001 | Ito et al. | 257/758 |
| 2002/0017692 | A1 * | 2/2002 | Shimizu et al. | 257/390 |
| 2002/0024143 | A1 * | 2/2002 | Or-Bach et al. | 257/758 |
| 2005/0111251 | A1 * | 5/2005 | Liaw | 365/154 |
| 2006/0237758 | A1 * | 10/2006 | Kinoshita | 257/296 |
| 2007/0200182 | A1 * | 8/2007 | Liaw | 257/393 |

\* cited by examiner

*Primary Examiner* — Fernando L Toledo
*Assistant Examiner* — Christine C Lau
(74) *Attorney, Agent, or Firm* — Duane Morris LLP

(57) ABSTRACT

Provided are semiconductor device cells, methods for forming the semiconductor device cells and a layout style for the semiconductor device cells. The device cells may be repetitive cells used throughout an integrated circuit. The layout style utilizes an area at the polysilicon level that is void of polysilicon and which can accommodate conductive leads therein or thereover. The conductive leads are formed of material typically used for contacts or vias and are disposed beneath the first metal interconnect level which couples device cells to one another. The subjacent local conductive leads may form subjacent signal lines allowing for additional power mesh lines to be included within the limited number of metal tracks that can be accommodated within a device cell and in accordance with metal track design spacing rules.

16 Claims, 3 Drawing Sheets

EFFICIENT SEMICONDUCTOR DEVICE CELL LAYOUT UTILIZING UNDERLYING LOCAL CONNECTIVE FEATURES

TECHNICAL FIELD

The disclosure relates, most generally, to semiconductor devices and, more particularly, to the design and layout of repetitive cells used in semiconductor devices.

BACKGROUND

Semiconductor devices are designed to achieve the highest integration levels possible. Higher levels of integration realize a cost savings because more features can be incorporated into a given device area, the integrated circuit or other semiconductor devices can be formed on smaller and smaller chips and a greater number of chips can be simultaneously manufactured on a given substrate.

Semiconductor devices are typically designed to include repeating cell structures. Each cell structure includes interconnected active devices and is coupled to other similar and different cells, and to other features. The cells may be NAND cells, NOR cells, stacked NMOS cells, stacked PMOS cells or any of various other cell structures used in semiconductor manufacturing. The cell structure arrangement is favored for design efficiency, i.e., once a cell is designed, it can be selected and used multiple times in the layout of the integrated circuit or other semiconductor device.

The placement of the cells in a device is critical. The layout of the features within the cells is also critical because it is desirable to form as many active devices as possible in a given cell. It is also desirable to design the cells to be as small as possible and to route as many signal and power lines as possible, through the cells for coupling to other cells and to other features. There are minimum spacing design rules that must be followed for the metal tracks such as the signal and power line tracks that extend through the cells. These minimum spacing design rules limit the number of metal tracks that can extend through the cells. As such, when more signal tracks are needed due to the complexity of the cell or the semiconductor device, they cannot simply be added. Rather, signal tracks must be added at the expense of power tracks, i.e. less space is available for power tracks and this limits device performance.

It would therefore be desirable to increase the number of metal tracks that may be accommodated within a cell and to generally increase integration levels and complexities of such repetitive cells.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

Figure 1:
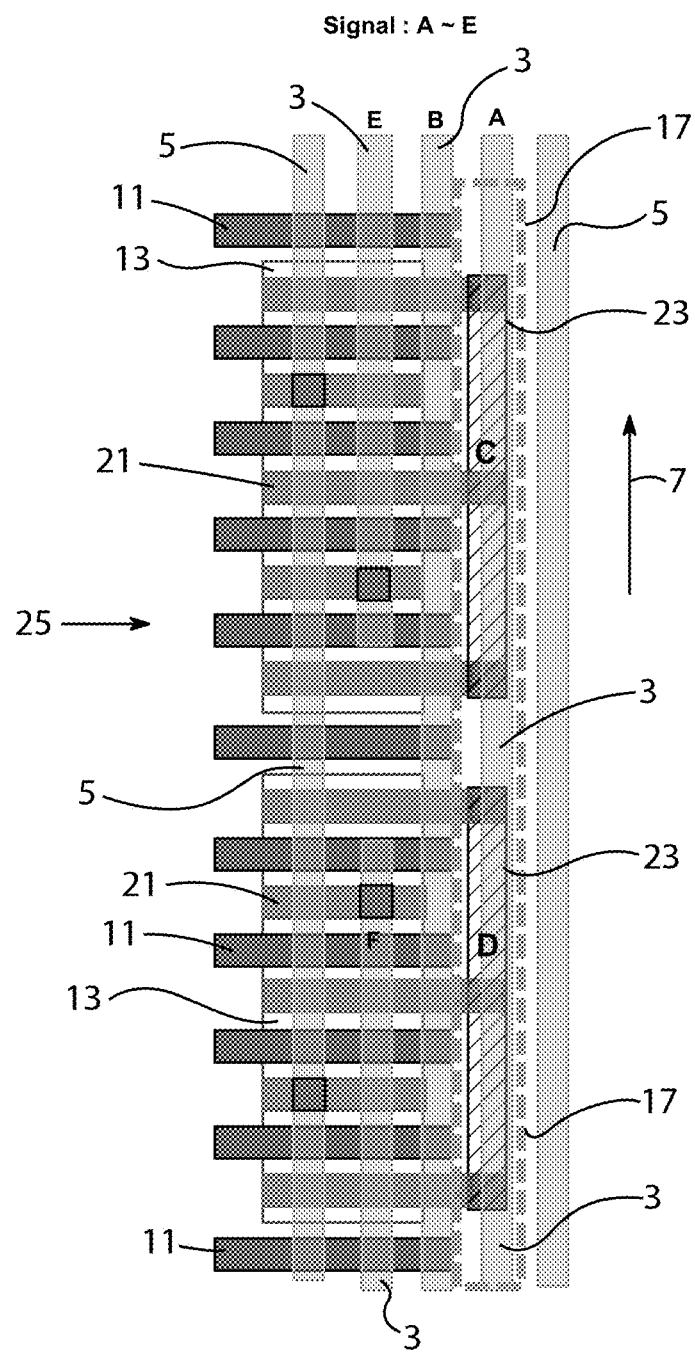
FIG. 1 is a plan view of an exemplary device cell layout of the disclosure and FIG. 1A is a plan view of repeating device cells.

The disclosure provides a layout for semiconductor device cells, including repeating semiconductor device cells, the semiconductor devices manufactured in accordance with the layout and a method for forming semiconductor devices according to the disclosed layout.

The disclosure provides an efficient device cell layout style which increases the number of metal tracks that can be accommodated within a cell of a given dimension and for a given set of metal track-to-metal track spacing design rules. The metal tracks are used for signal and power mesh lines that extend into the cells, through the cells and out of the cells and which connect cells to other cells and to other devices. The metal tracks are formed of a first metal interconnect level. The first metal interconnect level is so named because it extends from cell to cell and to various other devices within the chip. It is common in semiconductor device design to align cells end to end along what is often referred to as the cell direction.

A polysilicon layer or layers is disposed beneath the first metal interconnect level at the polysilicon level and includes polysilicon structures that serve as transistor gates, capacitor plates and as other active device features. Beneath the polysilicon level is the active area, typically formed within the substrate itself.

The disclosure utilizes a void area in the polysilicon layer—i.e. an area at the polysilicon level void of polysilicon—and provides for conductive features to be formed below the first metal interconnect level and in or over the void area of the polysilicon level. This is enabled because of the void area. If not for the void area these conductive features beneath the first metal interconnect level and which extend lengthwise in the form of conductive leads, would either be shorting to polysilicon if formed on the polysilicon level or would be laterally shorted to polysilicon or coexistent with polysilicon if formed at the polysilicon level. The conductive features are local interconnect leads that extend lengthwise and are local in that they do not extend from cell to cell. These underlying local conductive features may extend along the cell direction or transverse to the cell direction and couple overlying power lines and signal lines to subjacent features such as transistor gates and source/drain regions. The subjacent local conductive leads may carry signals and serve as signal lines. As such, a device cell that is sized to accommodate X number of metal tracks at the first metal interconnect level, i.e. X number of signal lines and power lines, may utilize a greater number than X signal lines and power lines because one or more signal lines may be a subjacent local conductive lead in addition to the signal lines of the metal tracks formed of the first metal interconnect level. Stated alternatively, a device cell that requires A signal lines and B power lines may utilize A minus n signal lines formed from the first metal interconnect level with n signal lines disposed beneath the first metal interconnect level. Compared to a design in which signal lines and power lines are only formed from the first metal interconnect level, a signal line may be added subjacently while maintaining the same number of power lines.

The additional integration levels achieved by the disclosure, allow for device cells to be formed of smaller dimensions. In one exemplary embodiment, about a 10% reduction in area for a device cell is achieved. The disclosure provides for IREM enhancement as the use of a subjacent signal line or lines allows for an additional power track to extend through the cell thereby enhancing the power mesh network. Electromigration (EM) issues are avoided and IR (current x resistor) drop across the cell is alleviated.

FIG. 1 is a plan view of an exemplary device cell layout. Device cell 25 may be a repeating cell used in SRAM or other memory devices. Device cell 25 may be an NAND cell, an NOR cell, a stacked NMOS cell, a stacked PMOS cell, or various other cells used in integrated circuits. The metal tracks of device cell 25 are formed of the first metal interconnect level, i.e. the first level of metal conventionally formed above active devices and above the polysilicon level or levels, and which extends from cell to cell or from the cells to other components external to the cell. The metal tracks of the first metal interconnect level include signal lines 3 and power mesh lines 5 which are all parallel. Power mesh lines 5 are alternatively referred to as power mesh leads and form a grid of metal lines coupled to positive supply voltage Vdd and a negative supply voltage Vss. The first metal interconnect layer may be formed of aluminum, copper or other suitable metals or alloys and may be formed using conventional or other means such as damascene processing.

Figure 1A:
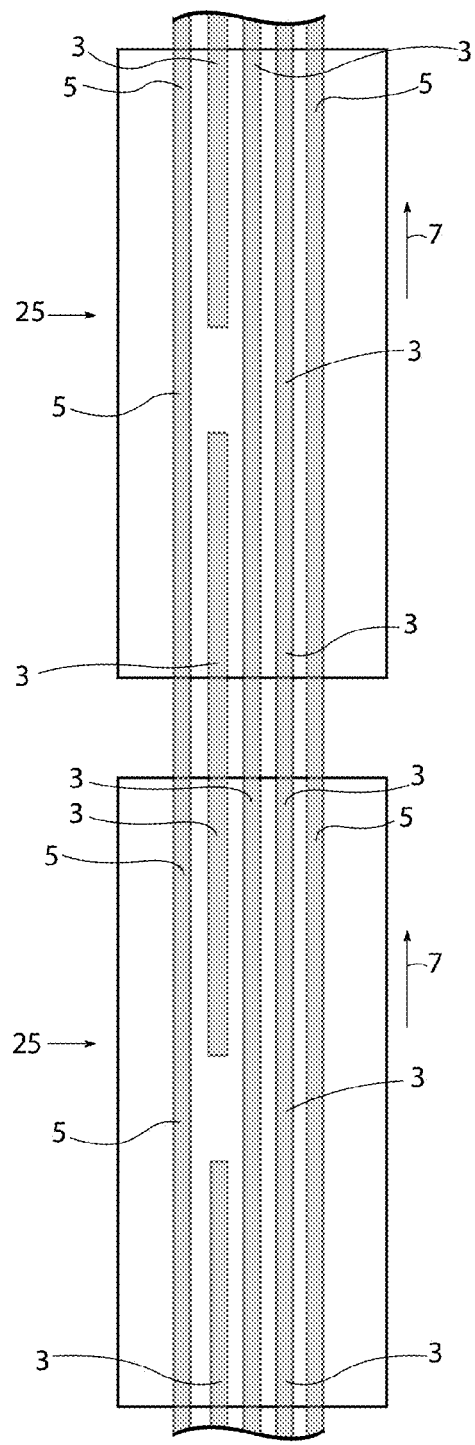

Signal lines A-E include signal lines A, B, F and E formed of the first metal interconnect layer, i.e. signal lines 3 and also signal lines C and D which are formed of a subjacent conductive material as will be discussed infra. Metal tracks including signal lines 3 and power mesh lines 5 extend along cell direction 7, i.e. the longitudinal direction with respective to device cell 25. In various exemplary design embodiments, a plurality of exemplary device cells 25 may be aligned and connected along cell direction 7. In particular, device cells 25 may be coupled to one another by the longitudinally extending metal tracks, i.e. signal lines 3 and power mesh lines 5 which are parallel to one another. FIG. 1A is a plan view showing a plurality of device cells 25 coupled by signal lines 3 and power mesh lines 5 and represent repeating cells used in SRAM or other memory devices. The details of device cell 25 are shown in FIG. 1. Returning to FIG. 1, polysilicon leads 11 extend transverse to cell direction 7 and may form gates of transistors formed utilizing active area 13. In the illustrated embodiment of FIG. 1, polysilicon leads 11 extend orthogonal to cell direction 7. Active area 13 includes the source and drain regions of transistors formed utilizing polysilicon leads 11 as gate electrodes. Polysilicon leads 11 are formed of a device layer subjacent to the first metal interconnect level, i.e. the polysilicon level which is subjacent to signal lines 3 and power mesh lines 5. At the polysilicon level, cut poly portion 17 is defined by the dashed line.

Cut poly portion 17 is produced at the polysilicon level masking operation and is an area at the polysilicon level but which is void of polysilicon. The disclosure provides and utilizes this void area to incorporate local subjacent conductive leads. Subjacent local conductive leads 21 extend orthogonal to cell direction 7 and are generally formed at the polysilicon level or between the first metal interconnect level and the polysilicon level and subjacent local conductive leads 23 extend parallel to cell direction 7 and are generally formed at the polysilicon level or between the first metal interconnect level and the polysilicon level. Subjacent local conductive leads 21 and 23 are local in the sense that they do not extend outside of device cell 25 shown in FIG. 1 but, rather provide connection to and within device cell 25. In the illustrated embodiment, the two parallel subjacent local conductive leads 23 are also identified as signal lines C and D. The subjacent local conductive leads 21 and 23 may be formed of aluminum or other suitable conductive materials used in semiconductor manufacturing. It can be seen that each of subjacent local conductive leads 21 and 23 include a length, i.e. they do not represent round or rectangular contact or via structures but rather are metal leads that include a length. In one exemplary embodiment, parallel subjacent local conductive leads 23 are formed subjacent the first metal interconnect layer and over the polysilicon level at cut poly portion 17 and subjacent local conductive leads 21 extend transverse to subjacent local conductive leads 23 at the polysilicon level and between polysilicon leads 11.

Figure 2:
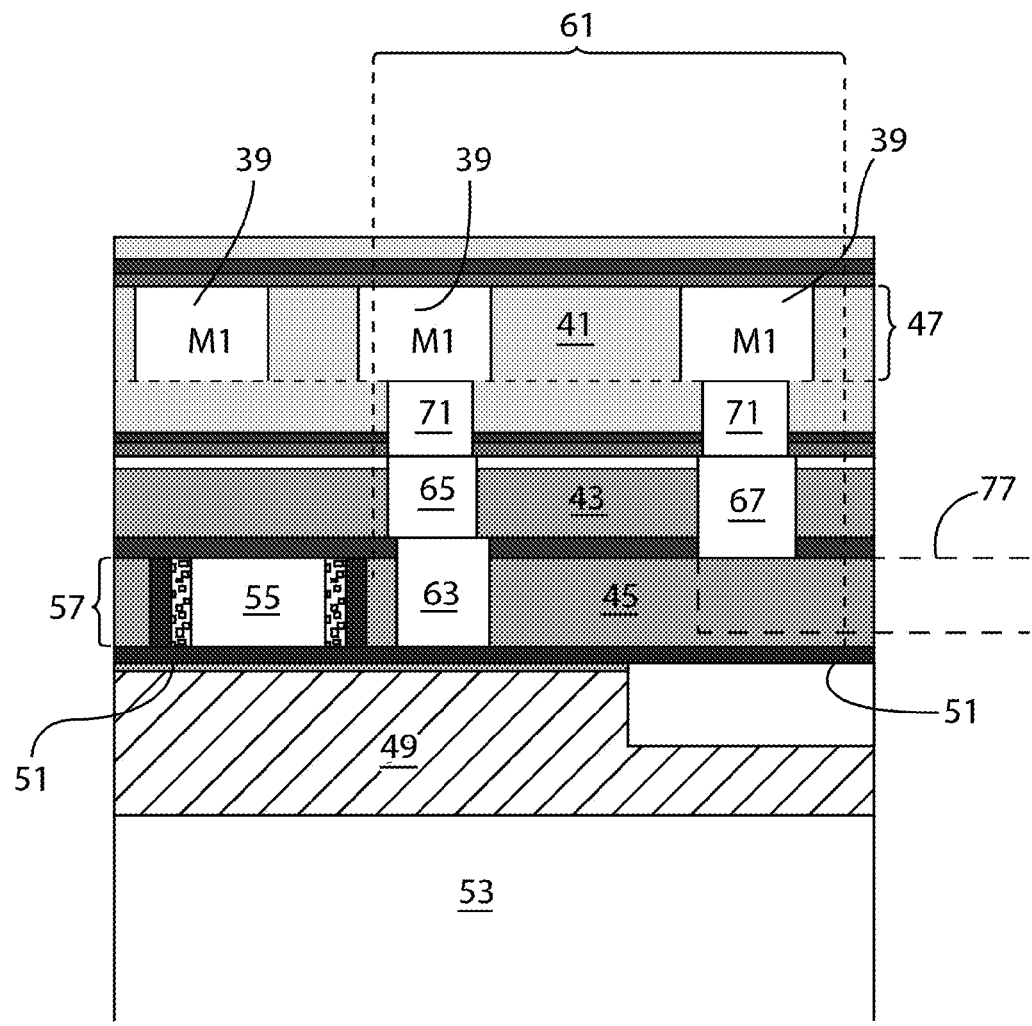
FIG. 2 is a cross-sectional view showing aspects of the device layout according to the disclosure.

FIG. 2 is a cross-sectional view showing exemplary interrelationships between metal tracks of the first metal interconnect layer and the subjacent local conductive leads. Metal tracks 39, also identified M1 represent metal tracks such as signal lines and power mesh lines as also shown in FIG. 1. Metal tracks 39 are formed of the first metal interconnect level, described supra. First metal interconnect level 47 includes metal tracks 39 which may be parallel to one another and are separated by an IMD, intermetal dielectric layer 41. A plurality of overlying metal interconnect layers, e.g. metal II, metal III, etc., may be formed over first metal interconnect level 47 but are not illustrated in the exemplary embodiment shown in FIG. 2. Metal tracks 39 are parallel as they extend in and out of the plane of the drawing page. Dielectric layers 41, 43 and 45 may be formed of various suitable insulating materials. Dielectric layers 41, 43 and 45 are stacked over one another and barrier layers or hard mask layers may be disposed between the respective insulating layers. Active area 49 is formed within substrate 53 and may be formed using various suitable doping means such as ion implantation and diffusion. Active area 49 extends up to substrate surface 51. Polysilicon lead 55 is disposed over substrate surface 51 at polysilicon level 57. Cut poly region 61 represents a portion of polysilicon level 57 that is void of polysilicon. Within cut poly region 61 may be one or more subjacent local conductive leads.

In the illustrated exemplary embodiment, either or both of subjacent local conductive leads 65 and 63 may extend along the same direction, i.e. parallel to metal tracks 39, i.e. subjacent local conductive leads 65 and 63 may extend parallel and in and out of the plane of the drawing sheet within cut poly region 61. This is enabled by the absence of polysilicon within cut poly region 61 of polysilicon level 57.

Subjacent local conductive lead 67 may similarly extend parallel to metal track 39 and may be coupled to metal track 39 by via 71. That is, subjacent local conductive leads 67 may extend in and out of the plane of the drawing sheet. Vias 71 extend from metal tracks 39 of first metal interconnect level 47 to the subjacent local conductive leads. Via 71 couples subjacent local conductive lead 67 to a metal track 39. Subjacent local conductive lead 67 is clearly disposed above polysilicon level 57 and according to the disclosure, subjacent local conductive lead 67 may be coupled to laterally spaced active device features such as transistor source and drains by a further subjacent local conductive lead formed at polysilicon level 57 and extending transversely with respect to subjacent local conductive lead 67. Dashed line 77 represents such an exemplary subjacent local conductive lead that may couple subjacent local conductive lead 67 to a laterally spaced active device feature. The subjacent local conductive lead suggested by the dashed line 77 may extend out of cut poly region 61 and between polysilicon leads, such as subjacent local conductive leads 21 shown in FIG. 1.

Other interconnection arrangements may be utilized in other exemplary embodiments. According to the other exemplary embodiments, the cut poly region 61 is utilized because conductive leads that are subjacent first metal interconnect level 47 and extend lengthwise, can do so within cut poly region 61 without undesirably shorting to polysilicon features. Furthermore, the subjacent conductive interconnect leads may be coupled to further subjacent conductive interconnect leads that are formed at the polysilicon level and which extend outwardly from cut poly region 61 to couple to active devices. In other exemplary embodiments, a subjacent local conductive lead may be formed at the polysilicon level and extending along the cell direction.

According to one aspect, provided is a device layout for a semiconductor device comprising a plurality of cells. At least a first cell of the cells comprises: a first metal interconnect level including a plurality of parallel signal lines and power mesh leads formed of a first metal and extending between and coupling the cells; a polysilicon level subjacent the first metal interconnect level and including polysilicon features therein and a void area void of polysilicon. The void area includes therein or thereover, local conductive leads connecting the parallel signal lines to source/drain regions of transistors formed at a level below the polysilicon level, the local conductive leads disposed beneath the first metal interconnect level.

According to another aspect, a device layout for a semiconductor device comprising a plurality of cells is provided. At least a first cell of the cells comprises: a first metal interconnect level including a plurality of parallel signal lines and power mesh lines formed of a first metal and extending between and coupling the cells; a polysilicon level disposed below the first metal interconnect level, the polysilicon level including polysilicon features therein and a void area that is void of polysilicon. A further parallel signal line formed of a conductive material, is disposed below the first metal interconnect level and on the polysilicon level in the void area.

According to another aspect, a semiconductor device comprising a plurality of cells is provided. At least a first cell of the cells extends in a longitudinal direction and comprises: a first metal interconnect level including a plurality of parallel signal lines and power mesh lines formed of a first interconnect metal and extending in the longitudinal direction along the first cell and between the cells; and subjacent metal leads disposed beneath the first metal interconnect level and including parallel metal leads extending in the longitudinal direction and transverse metal leads extending orthogonal to the longitudinal direction, the transverse leads contacting at least one laterally spaced subjacent active devices The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A device layout for a semiconductor device comprising:
   a plurality of cells, at least a first cell of said cells comprising:
   a first metal interconnect level including a plurality of parallel signal lines and power mesh leads formed of a lowermost metal level that extends between and couples said cells, wherein each of said plurality of parallel signal lines and power mesh lines extend and couple said cells along a longitudinal cell direction;
   a polysilicon level subjacent said first metal interconnect level and including polysilicon features therein and a void area void of polysilicon and including therein, local conductive lines connecting said parallel signal lines to active device regions formed at a level below said polysilicon level, said local conductive lines disposed beneath said first metal interconnect level and completely contained within said void area,
   wherein said cells each have a length defining said longitudinal direction and a cell width being less than said length, said local conductive lines each have a length longer than a line width thereof and couple laterally spaced apart features.

2. The device layout as in claim 1, wherein said local conductive lines are contained within said first cell.

3. The device layout as in claim 1, wherein said active device regions comprise source/drain of transistors, said local conductive lines include a lower level of local conductive features coupled directly to said source/drain regions and an upper level of local conductive features coupling said lower level to said plurality of parallel signal lines of said first metal interconnect level.

4. The device layout as in claim 3, wherein said upper level include upper lines extending parallel to said parallel signal lines and power mesh lines and disposed above said polysilicon level and said lower level comprises lower lines extending transverse to said upper leads and disposed at said polysilicon level.

5. The device layout as in claim 1, wherein said local conductive lines comprise parallel lines that extend parallel to said parallel signal lines and power mesh leads and are contained within said first cell.

6. The device layout as in claim 5, wherein said local conductive lines further comprise transverse lines that extend perpendicular to said parallel lines.

7. The device layout as in claim 6, wherein said transverse lines are coupled directly to source/drain regions and said parallel leads couple said transverse lines together.

8. The device layout as in claim 1, wherein said local conductive lines are formed of aluminum.

9. The device layout as in claim 1, wherein at least one said local conductive line comprises a further signal line.

10. A device layout for a semiconductor device comprising:
- a plurality of cells, at least a first cell of said cells comprising:
- a first metal interconnect level including a plurality of parallel signal lines and power mesh leads formed of a lowermost metal level that extends between and couples said cells, wherein each of said plurality of parallel signal lines and power mesh lines extend and couple said cells along a longitudinal cell direction;
- a polysilicon level disposed below said first metal interconnect level, said polysilicon level including polysilicon features therein and a void area that is void of polysilicon; and
- a further parallel signal line formed of a conductive material, disposed below said first metal interconnect level and completely within said void area,
- wherein said cells each have a length defining said longitudinal direction and a cell width being less than said length, said further parallel signal line has a length longer than a line width thereof and couple laterally spaced apart features.

11. The device layout for a semiconductor device as in claim 10, wherein said conductive material comprises metal and said further parallel signal line is disposed on said polysilicon level.

12. The device layout for a semiconductor device as in claim 10, wherein said further parallel signal line is coupled to adjacent further conductive leads that are coupled to source/drain regions of transistors.

13. The device layout for a semiconductor device as in claim 10, wherein said further parallel signal line is contained within said first cell.

14. The device layout for a semiconductor device as in claim 10, further comprising a second further parallel signal line formed of said conductive material, contained within said first cell completely within said void area and linearly aligned with said further parallel signal line.

15. A device layout for a semiconductor device comprising:
- a plurality of cells, at least a first cell of said cells comprising:
- a first metal interconnect level including a plurality of parallel signal lines and power mesh lines formed of a lowermost metal level that extends between and couples said cells, wherein each of said plurality of parallel signal lines and power mesh lines extend and couple said cells along a longitudinal cell direction;
- a polysilicon level subjacent said first metal interconnect level and including polysilicon features therein and a void area void of polysilicon and including therein, local conductive lines connecting said parallel signal lines to active device regions formed at a level below said polysilicon level, said local conductive lines disposed beneath said first metal interconnect level and completely contained within said void area,
- wherein said cells each have a length defining said longitudinal direction and a width being less than said length and said local conductive lines include upper lines extending parallel to said parallel signal lines and power mesh lines and disposed above said polysilicon level and lower lines extending transverse to said upper lines and disposed at said polysilicon level, each of said upper lines and said lower lines having a length greater than a width thereof.

16. The device layout as in claim 15, wherein said active device regions comprise source/drain of transistors, said lower lines are coupled directly to said source/drain regions and said upper lines couple said lower lines to said plurality of parallel signal lines of said first metal interconnect level.

* * * * *